(12) United States Patent
Choi

(10) Patent No.: US 10,224,501 B2
(45) Date of Patent: Mar. 5, 2019

(54) ORGANIC LIGHT EMITTING DISPLAY PANEL INCLUDING HOLE INJECTION LAYER AND HOLE TRANSPORT LAYER HAVING A SEPARATION PART ON A BANK OF EACH SUB-PIXEL

(71) Applicant: LG DISPLAY CO., LTD., Seoul (KR)

(72) Inventor: Dong-Il Choi, Gumi-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/821,326

(22) Filed: Nov. 22, 2017

(65) Prior Publication Data

US 2018/0151825 A1  May 31, 2018

(30) Foreign Application Priority Data

Nov. 30, 2016 (KR) .................. 10-2016-0162380

(51) Int. Cl.
*H01L 27/32* (2006.01)
*H01L 51/50* (2006.01)
*H01L 51/52* (2006.01)
*G06F 1/16* (2006.01)

(52) U.S. Cl.
CPC ............ *H01L 51/5088* (2013.01); *G06F 1/16* (2013.01); *H01L 27/3216* (2013.01); *H01L 27/3218* (2013.01); *H01L 27/3246* (2013.01); *H01L 51/504* (2013.01); *H01L 51/5036* (2013.01); *H01L 51/5056* (2013.01); *H01L 51/5072* (2013.01); *H01L 51/5096* (2013.01); *H01L 51/5206* (2013.01); *H01L 51/5221* (2013.01); *H01L 2251/558* (2013.01)

(58) Field of Classification Search
CPC ............. H01L 27/3216; H01L 27/3218; H01L 27/3246; H01L 51/5036; H01L 51/5056; H01L 51/5072
See application file for complete search history.

(56) References Cited

U.S. PATENT DOCUMENTS

2013/0341607 A1* 12/2013 Heo .................. H01L 51/56
257/40

* cited by examiner

*Primary Examiner* — Hoai V Pham
(74) *Attorney, Agent, or Firm* — Birch, Stewart, Kolasch & Birch, LLP

(57) ABSTRACT

An organic light emitting display panel prevents current leakage to adjacent sub-pixels through a common layer having high hole mobility. Layers having high electrical conductivity such as hole injection layers are separately formed in respective sub-pixels.

12 Claims, 10 Drawing Sheets

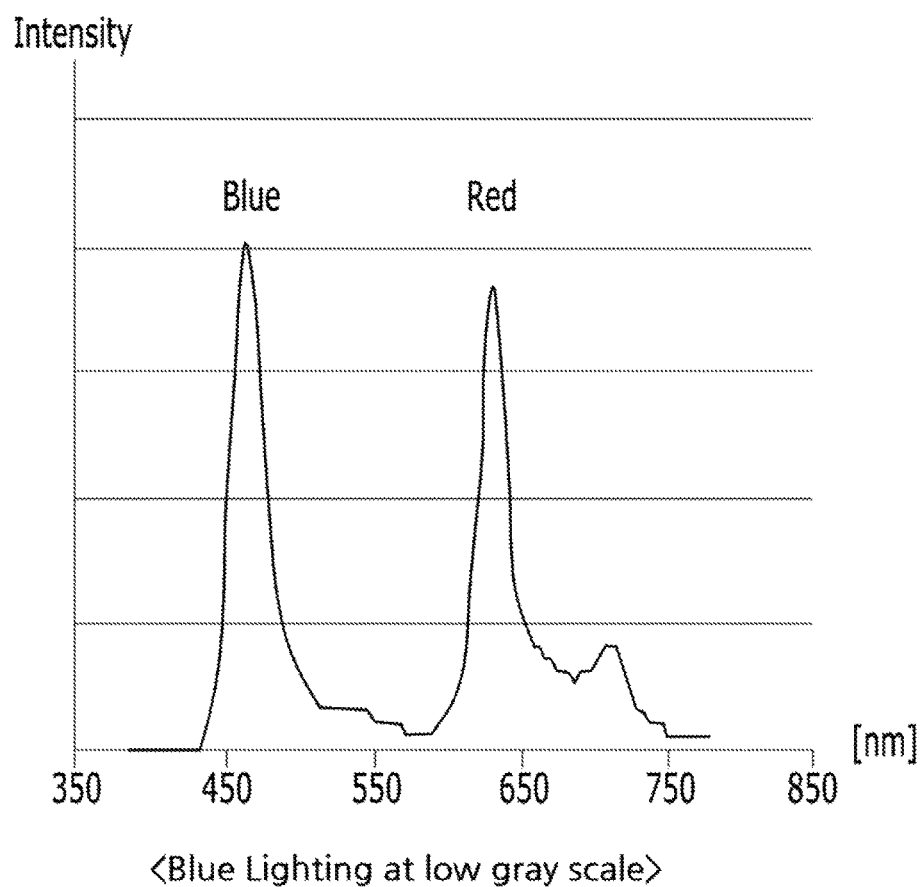

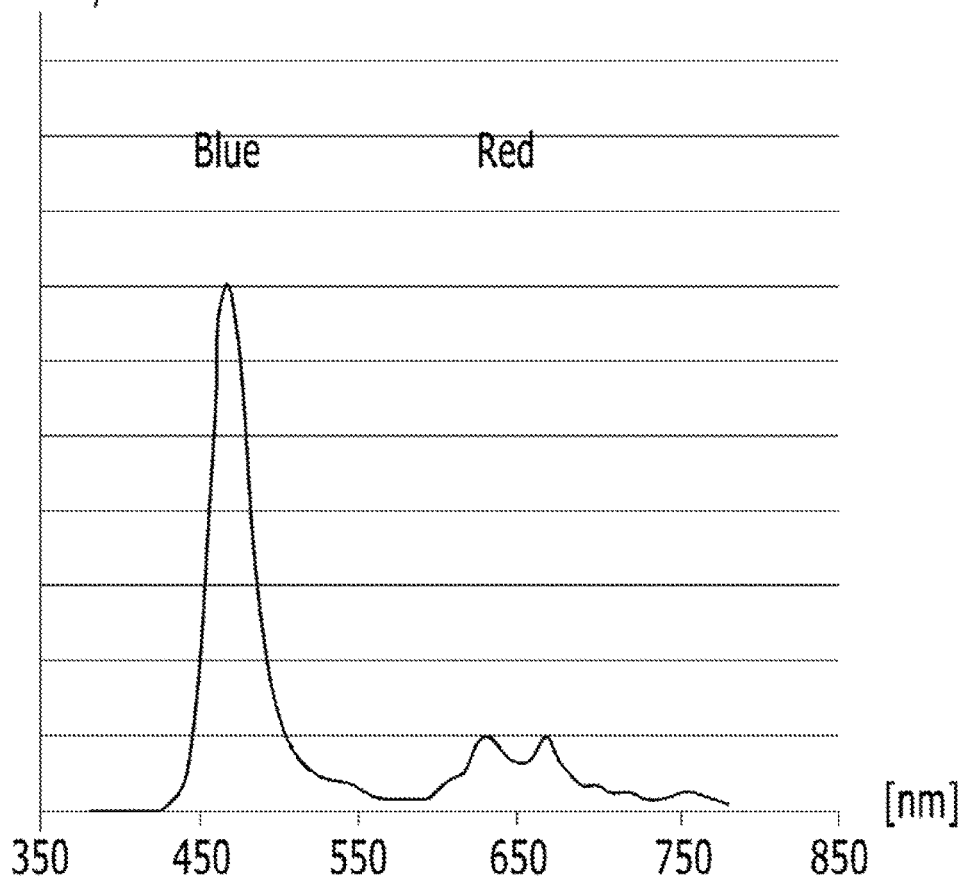

ORGANIC LIGHT EMITTING DISPLAY PANEL INCLUDING HOLE INJECTION LAYER AND HOLE TRANSPORT LAYER HAVING A SEPARATION PART ON A BANK OF EACH SUB-PIXEL

This application claims the priority benefit of Korean Patent Application No. 10-2016-0162380, filed on Nov. 30, 2016, which is hereby incorporated by reference as if fully set forth herein.

BACKGROUND OF THE INVENTION

Field of the Invention

The present invention relates to an organic light emitting element, and more particularly, to an organic light emitting display panel which prevents current leakage to adjacent sub-pixels through a common layer having high hole mobility.

Discussion of the Related Art

In the recent information-dependent era, the field of displays visually representing electrical information signals has remarkably advanced. In response to this trend, a variety of flat display devices having superior performance such as slimness, low weight and low power consumption have been developed and are rapidly replacing conventional cathode ray tubes (CRTs).

Specific examples of the flat display devices include liquid crystal display (LCD) devices, plasma display panel (PDP) devices, field emission display (FED) devices, organic light emitting display (OLED) devices and the like.

Among them, organic light emitting display devices are considered to have competitive applications since they remove the necessity of a separate light source, offer compactness of devices and show clear color.

Such an organic light emitting display device includes an organic light emitting element which independently operates a pixel on a sub-pixel basis. The organic light emitting element includes an anode, a cathode and a plurality of organic layers provided between the anode and the cathode.

In addition, the organic layers include a hole injection layer, a hole transport layer, an organic light emitting layer and an electron transport layer stacked in this order from the anode. Among them, substantially, holes combine with electrons to form excitons and their energy is dropped to the ground state, and at this time, the organic light emitting layer emits light. Other layers serve to transport holes or electrons to the organic light emitting layer.

In addition, for color representation, the organic light emitting display device includes sub-pixels which are divided into red, green and blue sub-pixels, and the organic light emitting layer to emit color light of the corresponding sub-pixel in each sub-pixel. In general, the organic light emitting layer is formed using a deposition method using a shadow mask.

However, wide shadow masks may lead to drooping due to the load thereof, thus causing a problem of deteriorated yield when repeatedly used. The organic layers excluding the light emitting layer are continuously formed in common in respective sub-pixels without any shadow mask.

However, current flows to the side part through the common layer provided in common in sub-pixels, more specifically, thus causing a problem of lateral current leakage.

FIG. 1 is a sectional view illustrating an impact of lateral leakage in an organic light emitting display panel according to a related art, and FIGS. 2A and 2B are graphs showing intensities as a function of wavelength when blue lighting (light emission for testing) is conducted at low and high gray scales in an organic light emitting display panel according to the related art.

In an example of the related art organic light emitting display panel, as shown in FIG. 1, in each sub-pixel on a substrate 10, a first electrode 11, a bank which overlaps an edge of the first electrode 11 to define a light emitting part, and a hole injection layer 13 and a hole transport layer 14 which cover the first electrode 11 and the bank 12 are continuously formed, and light emitting layers 16 (a red light emitting layer) and 17 (a blue light emitting layer), an electron transport layer 18 and a second electrode 19 are sequentially formed thereon.

In addition, a red sub-pixel which has a light emitting area located to be higher than those of other color sub-pixels depending on resonance conditions in the area between the first and second electrodes 11 and 19 may be further provided with an auxiliary hole transport layer 15 between the hole transport layer 14 and the red light emitting layer 16 to adjust a lighting height. The location having a maximum wavelength between the first and second electrodes 11 and 19 may be set to be different among respective light emission colors. The height of the red sub-pixel disposed is the greatest, the height of the green sub-pixel disposed is middle and the height of the blue sub-pixel located is the smallest. Accordingly, the green sub-pixel may also be provided with an auxiliary hole transport layer between the hole transport layer and the green light emitting layer, and the auxiliary hole transport layer provided in the green sub-pixel may have a smaller thickness than the auxiliary hole transport layer 15 of the red sub-pixel.

However, as shown in FIG. 1, upon low-gray scale blue lighting (light emission for testing), the organic light emitting display panel involves unintended lighting of the adjacent red sub-pixel as well. This means a phenomenon in which, although a voltage between the first electrode and the second electrode of the blue sub-pixel is applied in order to emit pure blue light, the adjacent sub-pixels is also driven due to the vertical electric field between the anode and the cathode in the driven blue sub-pixel as well as current leaked to the side part through the common layer. Such lateral leakage current is clearly visible upon low-gray scale representation as shown in FIG. 2A. This is because, when, due to the lateral leakage current horizontally flowing in the blue sub-pixel, current flows through common organic layers, off-state adjacent red sub-pixel has similar actions to when it turns on. In this case, color purity may be deteriorated and gray scale of pure blue is difficult to represent.

This is because even weak leakage current can lead to similar lighting effects, since the driving voltage required for red light emission is lower than the driving voltage required for blue light emission. As shown in FIG. 2B, although a strong vertical electric field is created in the blue sub-pixel upon blue high-gray scale lighting (light emission for testing), unintended red lighting of red sub-pixel also occurs during blue light emission for testing, but the impact by the horizontal current is less as compared to vertical electric field and the intensity of red light emission for testing is thus lower than that of bright blue for testing and is less visible.

However, unintended light emission of different colors of sub-pixels is observed at both low and high gray scales.

In particular, such different color of lighting resulting from lateral leakage current causes color mixing upon low-gray scale representation, thus disadvantageously making it impossible to normally render the intended color.

In addition, the impact of the lateral leakage current on the adjacent sub-pixel increases, as the hole mobility of the organic layer used as the common layer increases.

SUMMARY OF THE INVENTION

Accordingly, the present invention is directed to an organic light emitting display panel that substantially obviates one or more problems due to limitations and disadvantages of the related art.

An object of the present invention is to provide an organic light emitting display panel which prevents current leakage to adjacent sub-pixels through a common layer having high hole mobility by patterning a hole injection layer or the like in each sub-pixel.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

The organic light emitting display panel according to the embodiments of the present invention can prevent current leakage by separately providing a hole injection layer having high electrical conductivity in each sub-pixel.

To achieve these objects and other advantages and in accordance with the purpose of the invention, as embodied and broadly described herein, an organic light emitting display panel includes a substrate including a plurality of sub-pixels, each sub-pixel including a light emitting part and a non-light emitting part surrounding the light emitting part, a first electrode provided in the light emitting part provided in each sub-pixel, a bank provided in the non-light emitting part; a hole injection layer provided in the light emitting part of each sub-pixel while contacting the first electrode, and having a separation part on the bank of each sub-pixel, a hole transport layer divided along the separation part and contacting the hole injection layer, a plurality of light emitting layers provided on the hole transport layer in the light emitting parts of respective sub-pixels; a first common layer provided on the light emitting layers over the sub-pixels, and a second electrode provided on the first common layer.

Preferably, an organic stack including a first common layer disposed between the bank and the second electrode at the separation part may have an electrical conductivity of less than 3.0E-9 S/cm.

In addition, the separation part may be provided in a part of the bank and the separation part is connected at the boundary between the sub-pixels.

The separation part may be spaced from the light emitting part by a predetermined distance. In this case, a thickness between the bank and the second electrode at the separation part may be smaller than a thickness between the bank and the second electrode at a region spaced by the predetermined distance between the light emitting part and the separation part.

In addition, an organic stack between the bank and the second electrode at a region spaced by the predetermined distance between the light emitting part and the separation part may have an electrical conductivity of 3.0E-9 S/cm to 5.0E-6 S/cm.

In addition, the hole injection layer and the hole transport layer may be provided at a region spaced by the predetermined distance between the light emitting part and the separation part.

The organic light emitting display panel may further include a second common layer between the hole transport layer and the light emitting layers over the sub-pixels.

In addition, the second common layer may include an organic material capable of transporting holes and blocking electrons, the first common layer may include an organic material capable of transporting electrons, and each of the first and second common layers may have an electrical conductivity of less than 3.0E-9 S/cm.

The hole injection layer and the hole transport layer may have the same opening area at the separation part.

In addition, the plurality of sub-pixels may comprise a red sub-pixel, a green sub-pixel and a blue sub-pixel, wherein the light emitting layer of the red sub-pixel includes a red light emitting layer, the light emitting layer of the green sub-pixel includes a green light emitting layer, and the light emitting layer of the blue sub-pixel includes a blue light emitting layer.

The blue light emitting layer may extend to the green sub-pixel and the red sub-pixel and may be provided on the green light emitting layer and the red light emitting layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIGS. 2A and 2B are graphs showing intensities as a function of wavelength upon blue light emission for testing at low and high gray scales in an organic light emitting display panel according to the related art;

DETAILED DESCRIPTION OF THE EMBODIMENTS

Figure 1:
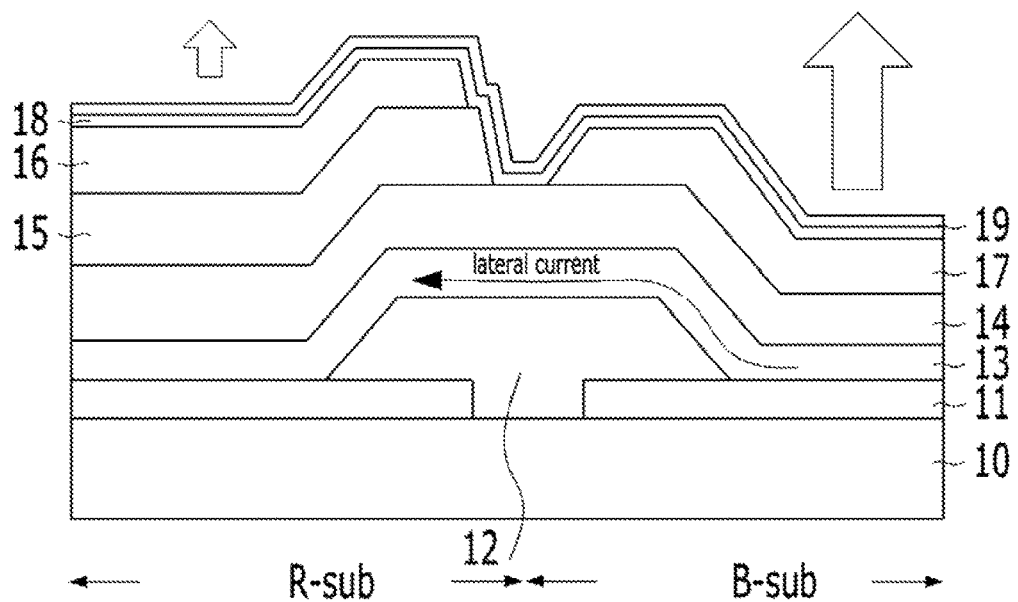
FIG. 1 is a sectional view illustrating an impact of lateral leakage in an organic light emitting display panel according to a related art.

Reference will now be made in detail to the preferred embodiments of the present invention, examples of which are illustrated in the accompanying drawings.

The advantages, features and methods of achieving the same of the present invention will be more clearly understood from the following detailed description taken in conjunction with the accompanying drawings. However, the present invention is not limited to a variety of embodiments described below and can be implemented in various forms. The embodiments of the present invention are provided only to completely disclose the present invention and fully inform a person having ordinary knowledge in the field to which the present invention pertains of the scope of the present invention. Accordingly, the present invention is defined by the scope of the claims.

The shape, size, ratio, angle, number and the like shown in the drawings to illustrate the embodiments of the present invention are only for illustration and are not limited to the contents shown in the drawings. Wherever possible, the same reference numbers will be used throughout the drawings to refer to the same or like parts. In the following description, detailed descriptions of technologies or configurations related to the present invention may be omitted so as not to unnecessarily obscure the subject matter of the present invention. When terms such as "including", "having" and "comprising" are used throughout the specification, an additional component may be present, unless "only" is used. A component described in a singular form encompasses components in a plural form unless particularly stated otherwise.

It should be interpreted that the components included in the embodiments of the present invention include an error range, although there is no additional particular description.

In describing a variety of embodiments of the present invention, when terms for positional relationships such as "on", "above", "under" and "next to" are used, at least one intervening element may be present between two elements unless "right" or "direct" is used.

In describing a variety of embodiments of the present invention, when terms related to temporal relationship, such as "after", "subsequently", "next" and "before", a non-continuous case may be present, unless "right" or "direct" is used.

In describing a variety of embodiments of the present invention, terms such as "first" and "second" may be used to describe a variety of components, but these terms only aim to distinguish the same or similar components from one another. Accordingly, throughout the specification, a "first" component may be the same as a "second" component within the technical concept of the present invention, unless specifically mentioned otherwise.

The respective features of various embodiments according to the present invention can be partially or entirely joined or combined and technically variably related or operated, and the embodiments can be implemented independently or in combination.

Throughout the specification, "LUMO (lowest unoccupied molecular orbital) energy level" and "HOMO (highest occupied molecular orbital) energy level" of any layer means LUMO and HOMO energy levels of a material which occupies most of a weight ratio of the corresponding layer, for example, a host material, unless LUMO and HOMO energy levels of a dopant doped in the corresponding layer are referred.

Throughout the specification, the term "HOMO energy level" means an energy level which is measured by cyclic voltammetry (CV) that determines an energy level from a relative voltage of a reference electrode having a known potential. For example, a HOMO energy level of any material can be measured based on, as the reference electrode, ferrocene having known oxidation and reduction potentials.

Throughout the specification, the term "doped" means that a material having different properties (wherein the different properties are, for example, n-type and p-type, or organic and inorganic materials) from those of the material which occupies most of a weight ratio of the corresponding layer is added in an amount lower than 10%. In other words, the "doped" layer means a layer, a host material and a dopant material of which can be distinguished in consideration of a weight ratio. In addition, "undoped" means all cases excluding "doped". For example, when any layer is formed as a single layer or a combination of materials having same or similar properties, the layer is included in the "undoped" layer. For example, when at least one of materials constituting any layer is p-type and all thereof are not n-type, the corresponding layer is included in the "undoped" layer. For example, when at least one of materials constituting any layer is an organic material and all thereof are not an inorganic material, the corresponding layer is included in the "undoped" layer. For example, when all of materials constituting any layer are an organic material, at least the other thereof is p-type, and an n-type material is less than 10% or a p-type material is less than 10%, the corresponding layer is included in the "doped" layer.

Throughout the specification, an electroluminescence (EL) spectrum is obtained by multiplication of (1) the photoluminescence (PL) spectrum curve which reflects inherent properties of a light emitting material such as a dopant or host material included in an organic light emitting layer, and (2) the out coupling emittance spectrum curve which is determined by the structure and optical properties of the organic light emitting element including an organic layer such as an electron transport layer.

Throughout the specification, the term "stack" means a unit structure which includes a hole transport layer, an organic layer including the hole transport layer and an organic light emitting layer disposed between the hole transport layer and an electron transport layer. The organic layer may further include a hole injection layer, an electron blocking layer, a hole blocking layer and an electron injection layer, and may further include other organic layers depending on the structure or design of the organic light emitting element.

Figure 3A:
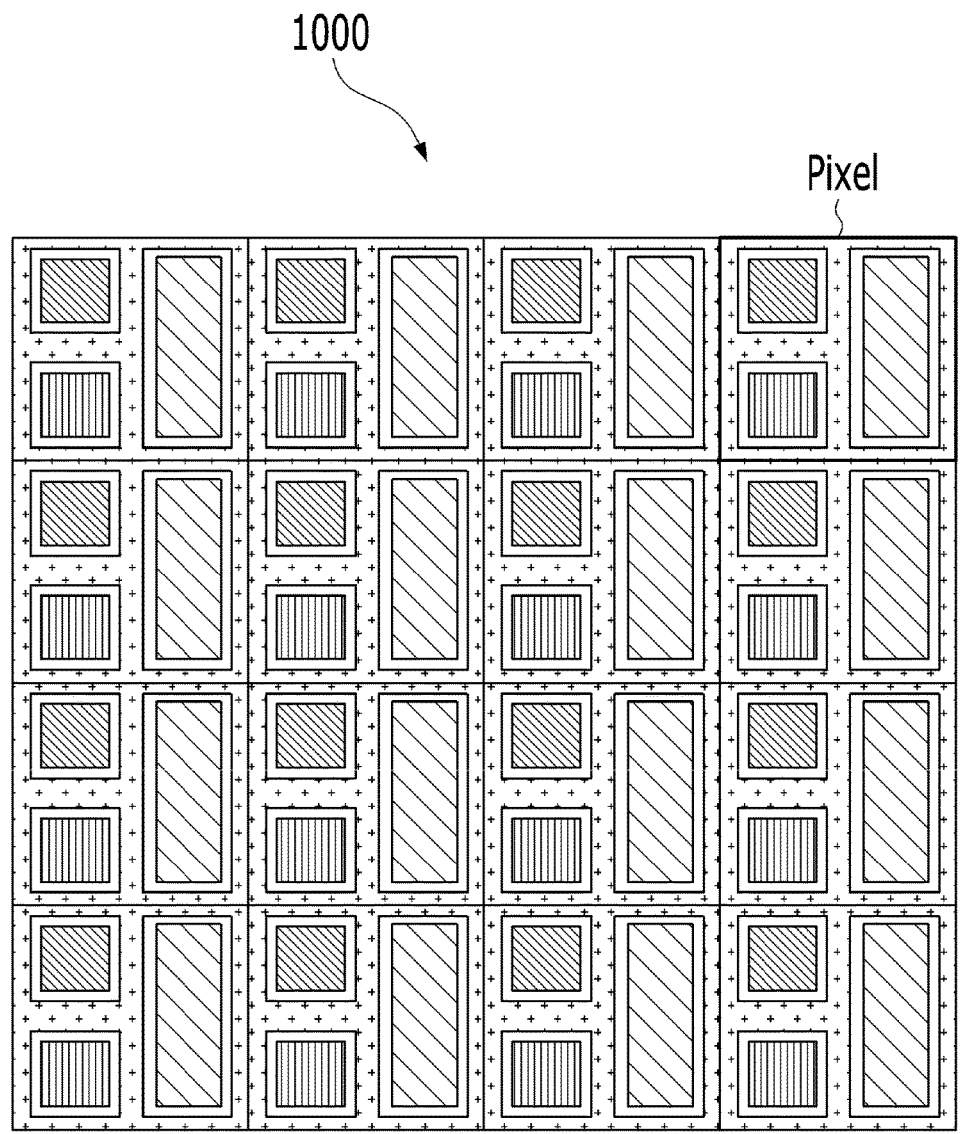
FIG. 3A is a plan view illustrating an organic light emitting display panel according to an embodiment of the present invention.
Figure 3B:
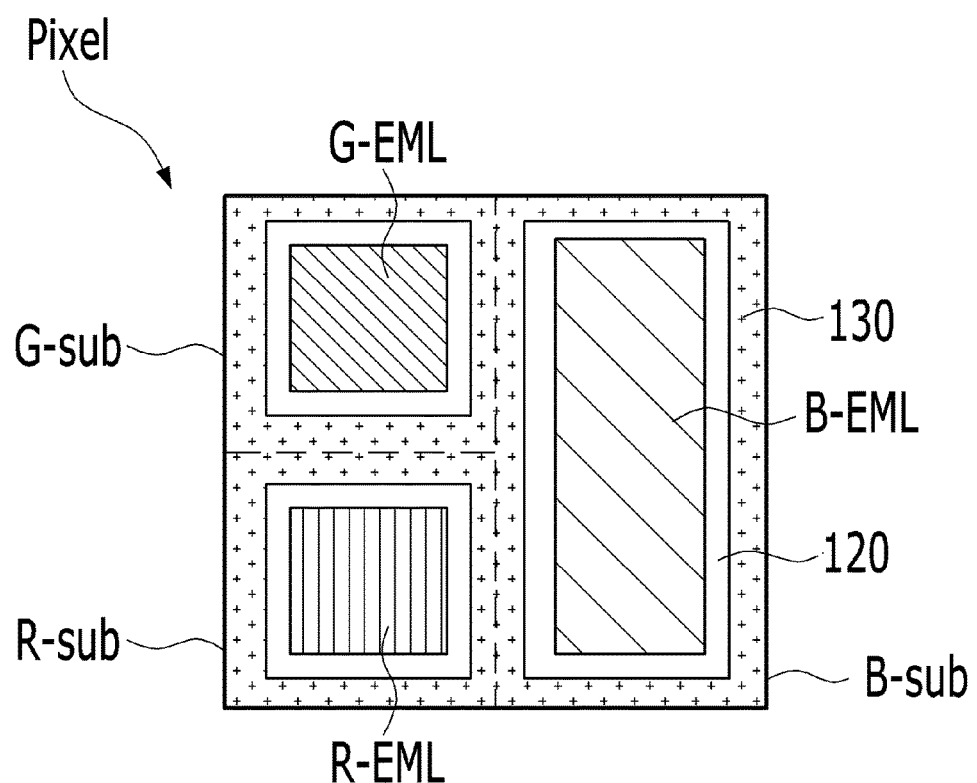
FIG. 3B is an enlarged view of one pixel shown in FIG. 3A.

FIG. 3A is a plan view illustrating an organic light emitting display panel according to an embodiment of the present invention and FIG. 3B is an enlarged view of one pixel shown in FIG. 3A. All the components of the organic light emitting display panel and device according to all embodiments of the present invention are operatively coupled and configured.

As shown in FIGS. 3A and 3B, the organic light emitting display panel 1000 according to the embodiment of the present invention includes a plurality of pixels regularly disposed and each pixel includes a first sub-pixel R-sub, a second sub-pixel G-sub and a third sub-pixel B-sub which emit different colors of light as shown by a dotted line in FIG. 3B. In the illustrated example, for example, the first sub-pixel R-sub is a red sub-pixel, the second sub-pixel G-sub is a green sub-pixel, and the third sub-pixel B-sub is a blue sub-pixel, but the present invention is not limited thereto. Thus, in a case where white is created by mixing colors emitted from sub-pixels in one pixel, the sub-pixels may be provided by other combination. In addition, in some cases, by combination provided to improve efficiency of white, in addition to red, green and blue sub-pixels to render white, a separate white sub-pixel to emit pure white may be further provided. The color emitted from each sub-pixel changes depending on color of light emitted from each of the provided light emitting layers R-EML, G-EML and BEML, and each light emitting layer R-EML, G-EML or B-EML includes a dopant to emit light with a certain wavelength constituting the light emitting layer and a host which has a predetermined bandgap to enable the dopant to perform its function.

Meanwhile, the illustrated example shows that the first to third sub-pixels R-sub, G-sub and B-sub do not have the same areas, and the third sub-pixel B-sub is wider than the first and second sub-pixels R-sub and G-sub. This is because insufficient efficiency of blue light emission is improved by area regulation since the known light emitting materials for red and green have better efficiency than the light emitting material for blue. When red, green and blue light emitting materials have the same efficiency in the same area through development and suitable selection of the light emitting material, the light emitting part of red, green and blue sub-pixels can be disposed in the same area.

In addition, each sub-pixel R-sub, B-sub or G-sub includes a light emitting part in the center and a non-light emitting part surrounding the light emitting part. At least the light emitting part is filled with a light emitting material R-EML, G-EML or B-EML. The light emitting material R-EML, G-EML, or B-EML may be deposited from the light emitting part to a part of the peripheral non-light emitting part, but the non-light emitting part is filled with a bank (e.g., represented by reference numeral "140" in FIG. 4) and is disposed on a vertical cross-section surface between the light emitting material and the first electrode 110. For this reason, no vertical electric field is substantially formed in the non-light emitting part provided with the bank, thus preventing the non-light emitting part from functioning as a light emitting part. Here, the element represented by reference numeral "130" of FIG. 3B is a separation part defined in the non-light emitting part, which is disposed in the non-light emitting part and is branched from the organic layer having strong electrical conductivity between adjacent sub-pixels. The separation part 130 isolates the hole injection layer having strong electrical conductivity, among organic layers between at least first and second electrodes and this isolation enables the electrical conductivity of the separation part 130 to be lower than the electrical conductivity of the organic layer between the first and second electrodes in the light emitting part. In addition, an element represented by reference numeral "120" is a part of the non-light emitting part excluding the separation part 130, which means a predetermined gap between the light emitting part and the separation part 130 and is an area where organic layers overlap under the second electrode 200 on the bank 140.

Hereinafter, the structure of a vertical cross-section of the organic light emitting display panel according to the embodiments of the present invention will be described with reference to the cross-sectional configuration.

Figure 4:
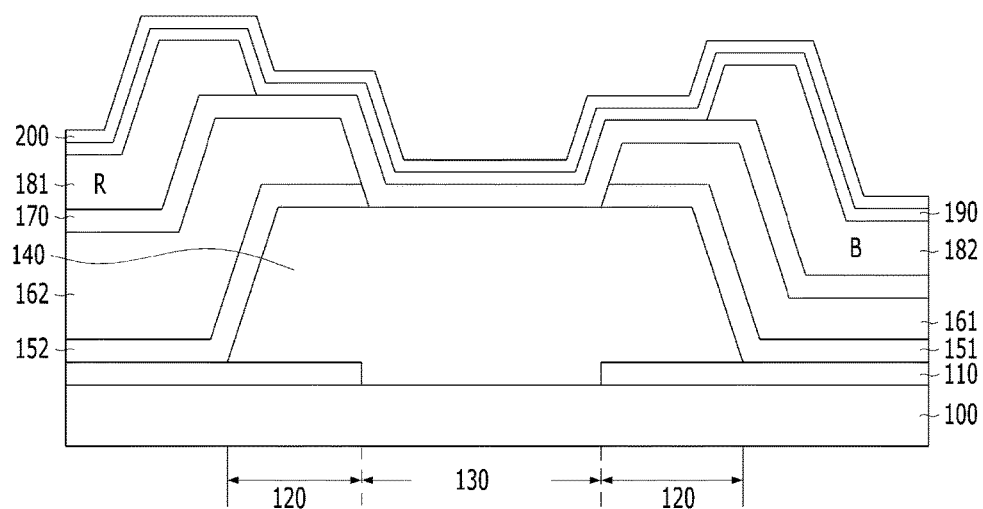
FIG. 4 is a sectional view of the boundary between two sub-pixels in the organic light emitting display panel according to the present invention.

FIG. 4 is a sectional view of the boundary between two sub-pixels in the organic light emitting display panel according to an embodiment of the present invention.

As shown in FIGS. 3A and 4, the organic light emitting display panel according to the present invention includes a substrate 100 which includes a plurality of sub-pixels R-sub, G-sub and B-sub, each including a light emitting part and a non-light emitting part surrounding the light emitting part, a first electrode 110 provided in the light emitting part of each sub-pixel, a bank 140 provided in the non-light emitting part, a hole injection layer 151 which contacts the first electrode 110 in the light emitting part of the sub-pixel and has a barrier 130 on the bank 140 of each sub-pixel, hole transport layers 161 and 162 which are separated based on the separation part 130 and contact the hole injection layers 151 and 152, respectively, a light emitting layer 181 or 182 provided on the hole transport layer of the light emitting part of each sub-pixel, a first common layer 190 provided over the plurality of sub-pixels on the light emitting layers 181 and 182 and a second electrode 200 provided on the first common layer.

The common layer in the organic light emitting display panel of the present invention is a kind of organic layer formed between the first and second electrodes 110 and 200, which is provided in common over the plurality of sub-pixels on the substrate 100.

Here, the first common layer 190 includes a material capable of transporting electrons and functions to transport electrons injected through the second electrode 220 to the light emitting layers 181 and 182.

FIG. 4 illustrates an example in which, in addition to the first common layer 190 on the light emitting layers 181 and 182, a second common layer 170 is further formed under the light emitting layers 181 and 182, but the second common layer 170 may be omitted, in some cases. As shown in the drawing, in the example in which the second common layer 170 is provided, the second common layer 170 functions as an electron blocking layer and serves to prevent electrons or excitons of the light emitting layers 181 and 182 from being injected into the hole transport layers 161 and 162 disposed therebelow, since it has a predetermined LUMO energy level. The second common layer 170 is formed by selecting a material, which has a higher LUMO energy level than the material of the relatively adjacent hole transport layer, among the hole transport materials, thereby facilitating transport of holes from the first electrode 110 to the light emitting layers 181 and 182 disposed thereabove.

In the organic light emitting display panel of the present invention, the hole injection layers 151 and 152 having high electrical conductivity in each sub-pixel include the separation part 130 in the non-light emitting part and are separately formed. In addition, the hole transport layers 161 and 162 on the hole injection layers 151 and 152 are formed using the same mask as the deposition mask for forming the hole injection layers 151 and 152 and thus have the same area of the separation part 130 as an opening area.

The hole injection layers 151 and 152 include a hole-transporting organic material in which a p-type dopant having higher hole mobility than other organic layers is incorporated. Here, since strong barrier from the first electrode 110 of the electrode ingredient is applied to holes on the interface between the first electrode 110 and the hole injection layers 151, 152, the p-type dopant is added in order to reduce the barrier when holes are injected and facilitate the injection of holes, but it may be a factor increasing electrical conductivity. The main material of the hole injection layers 151 and 152, which is a hole transporting and hole injecting organic material, may have a HOMO energy level which is similar to the absolute value of the work function of the first electrode 110. Here, the p-type dopant may be a p-type organic or inorganic dopant. In the case of the p-type organic dopant, the compounds represented by the following Formulae 1 to 4 may include one or more selected from the group consisting of hexadecafluorophthalocyanine (F16CuPc), 11,11,12,12-tetracyanonaphtho-2,6-quinodimethane (TNAP), 3,6-difluoro-2,5,7,7,8,8-hexacyano-quinodimethane (F2-HCNQ) and tetracyanoquinodimethane (TCNQ).

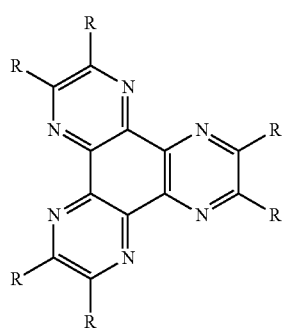

[Formula 1]

In Formula 1, R is a cyano group, a sulfonic group, a sulfoxide group, a sulfonamide group, a sulfonate group, a nitro group, or a trifluoromethyl group.

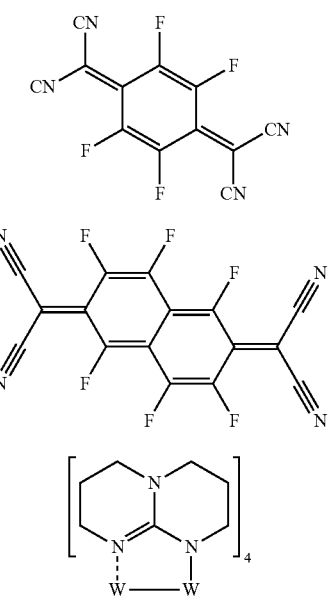

[Formula 2]

[Formula 3]

[Formula 4]

In addition, in another example, when the p-type dopant is an inorganic dopant, it may include one or more selected from the group consisting of metal oxide and metal halide. Specifically, the p-type inorganic dopant may include one or more selected from the group consisting of $MoO_3$, $V_2O_5$, $WO_3$, $SnO_2$, $ZnO$, $MnO_2$, $CoO_2$, $ReO_3$, $TiO_2$, $FeCl_3$, $SbCl_5$ and $MgF_2$.

In the organic light emitting display panel of the present invention, the hole injection layers 151 and 152 are separately patterned in respective sub-pixels, to form the separation part 130 at the boundary between the sub-pixels, that is, an area where the hole injection layers 151 and 152 are not formed and thereby remove the layer causing lateral current leakage. Accordingly, the organic layers left between the bank 140 and the second electrode 200 in the separation part 130 have an electrical conductivity of lower than 3.0E-9 S/cm, thus structurally preventing creation of a current pass leaked toward the side from adjacent sub-pixels. That is, although some common layers are present on the separation part 130, these common layers have low electrical conductivity, thus preventing leakage current causing light emission from flowing toward the adjacent sub-pixel.

In addition, the separation part 130 is provided in a part of the bank 140 and may be connected at the boundary between the sub-pixels as shown in FIGS. 3A and 3B.

In addition, the separation part 130, as shown in FIGS. 3A and 3B, may be spaced from the light emitting parts R-EML, G-EML and B-EML by a predetermined distance. In this case, as shown in FIG. 4, the thickness between the bank 140 and the second electrode 200 in the separation part 130 is smaller than the thickness between the bank 140 and the second electrode 200 in the gap 120 between the light emitting part and the separation part 130. This is because the hole injection layer and the hole transport layers are further provided in the gap 120. In some cases, the light emitting layers 181 and 182 may extend to the gap 120. In this case, the gap 120 (between the light emitting part and the separation part) may have higher electrical conductivity than that of the separation part 130 and the electrical conductivity may be 3.0E-9 S/cm to 5.0E-6 S/cm. In any case, the gap 120 has an electrical conductivity not higher than that of the hole injection layers 151 and 152, and the separation part 130 functions to separate lateral leakage current, thus preventing the problem of emission of other color light caused by the gap 120.

Meanwhile, the first common layer 190 is formed using an organic material capable of transporting holes and blocking electrons, the second common layer 170 is formed using an organic material capable of transporting electrons transporting, and each of the first and second common layers has an electrical conductivity of 3.0E-9 S/cm or less and includes an organic material having lower electrical conductivity than the hole injection layers 151 and 152 disposed therebelow. This aims to reduce electrical conductivity of the organic material left on the separation part 130.

FIG. 4 shows a neighboring structure of a blue sub-pixel and a red sub-pixel which is the most impacted by lateral leakage current, among sub-pixels adjacent to the blue sub-pixel. The separation part 130 disposed in the non-light emitting part may be disposed in only the boundary between sub-pixels due to leakage current, as shown in FIG. 4, or on the boundaries between the respective sub-pixels in the entire non-light emitting part, as shown in FIGS. 3A to 3B.

Meanwhile, the non-light emitting part disposed around each sub-pixel is filled with the bank 130 and the bank 130 overlaps an edge of the first electrode 110 and is disposed under the hole injection layers 151 and 152.

Here, the first electrode 110 is formed in at least the light emitting part and in a part of the non-light emitting part as well, in consideration of process margin, and is formed as a single transparent oxide film such as an indium tin oxide (ITO) film, or a reflective electrode having a stack structure of two or more layers including the transparent oxide film and an alloy such as Ag alloy. When the process margin is small, a region overlapping the bank 140 corresponding to the first electrode 110 and the non-light emitting part is also small.

In addition, the second electrode 200 includes an alloy of Mg:Ag or Ca:Ag and is formed on the first electrode 110 after interposing an organic layer between the second electrode 200 and the first electrode. The second electrode 200 may be formed at the side where the organic layers face each other using an inorganic material of an alkali metal or alkaline earth metal such as LiF or $Li_2O$ or Li, Ca, Mg, Sm and may further include an electron injection layer made of LiF or $Li_2O$.

Meanwhile, the hole transport layers 161 and 162 and the second common layer 170 are formed using any one hole transporting organic material selected from an arylene group, an aryl group and a heterocyclic group, and their bandgap properties can be changed by applying different substituents thereto.

In addition, the first common layer 190 may be, for example, formed using any one of known electron transporting materials such as Alq3, BCP (1,10-phenanthroline derivative), oxadiazole derivatives (tBu-PBD), carbazole derivatives, or phenylquinoxaline Derivatives having a starburst type.

Hereinafter, a vertical cross-sectional structure of the entire sub-pixels of one pixel will be described.

Figure 5:
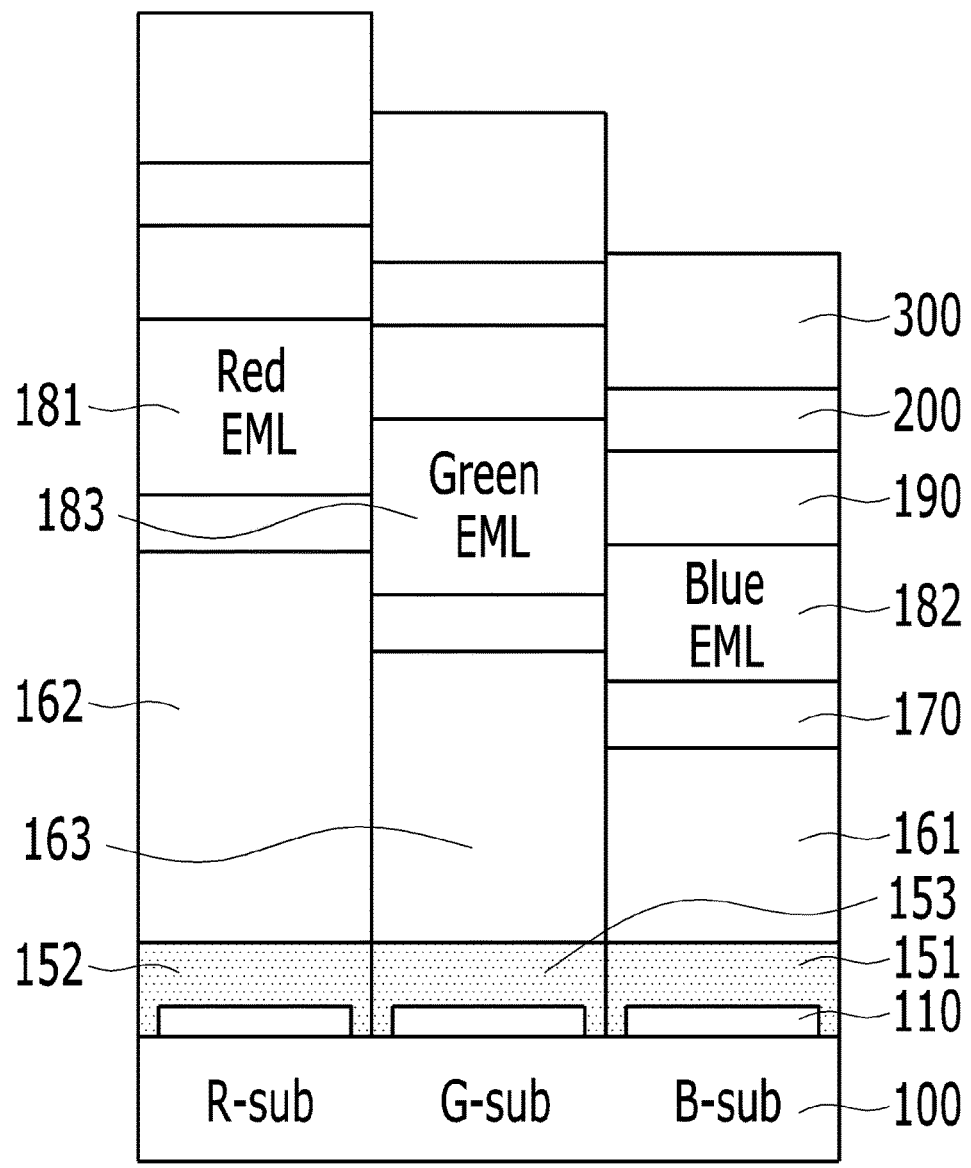
FIG. 5 is a sectional view schematically illustrating one pixel of an organic light emitting display panel according to a first embodiment of the present invention.

FIG. 5 is a sectional view schematically illustrating one pixel of an organic light emitting display panel according to a first embodiment of the present invention.

As shown in FIG. 5, the organic light emitting display panel according to the first embodiment includes hole injection layers 151, 152 and 153, and hole transport layers 161, 162 and 163 which are separately formed in respective sub-pixels. The hole injection layers 151, 152 and 153 and the hole transport layers 161, 162 and 163 are formed using a common deposition mask. The hole injection layers 151, 152 and 153 of the respective sub-pixel areas may be the same material, or different materials according to compatibility with the adjacent hole transport layers 161, 162 and 163. In some cases, the hole injection layers 151, 152 and 153 may be formed by changing only the content of the p-type dopant while using the same host. In addition, the thickness of the hole transport layers 161, 162 and 163 is determined depending on the optical distance between the light emission colors of respective sub-pixels and these hole transport layers may be the same or different materials.

The second common layer 170 formed on the hole transport layers 161, 162 and 163 is formed in common in respective sub-pixels and is disposed on the bank (140 in FIG. 4) disposed at the boundary between the sub-pixels as well.

In addition, the light emitting layers 181, 182 and 183 of respective sub-pixels are provided corresponding to the respective sub-pixels. The pixel is divided into a red sub-pixel, a green sub-pixel and a blue sub-pixel, and the light emitting layer of the red sub-pixel includes a red light emitting layer 181, the light emitting layer of the green sub-pixel includes a green light emitting layer 183, and the light emitting layer of the blue sub-pixel includes a blue light emitting layer 182.

Next, an electron-transporting first common layer 190 and a second cathode 200 are formed in common over the sub-pixels.

The illustrated drawing shows that the main area of sub-pixels is a light emitting part and the bank is omitted. Accordingly, the separation part defined on the bank is determined with reference to the structure of FIG. 4.

Surprisingly, FIG. 5 shows that, although layers provided in common in the sub-pixels, like the first and second common layers 190 and 170 and the second electrode 200 are present, the thicknesses of the hole transport layers 161, 162 and 163 which are controlled for the optical distance suitable for respective light emission colors under the light emitting layers 181, 182 and 183 are different among the sub-pixels, and as a result, the location of the second electrode 200 determined in consideration of step may be different among the sub-pixels.

In addition, the element 300, not described above, is a capping layer which covers the second electrode 190 in sub-pixels and functions to protect an organic light emitting diode provided in each sub-pixel and control out coupling of the upper part. The capping layer 300 may cover an area larger than the total area of the second electrode 190.

Figure 6:
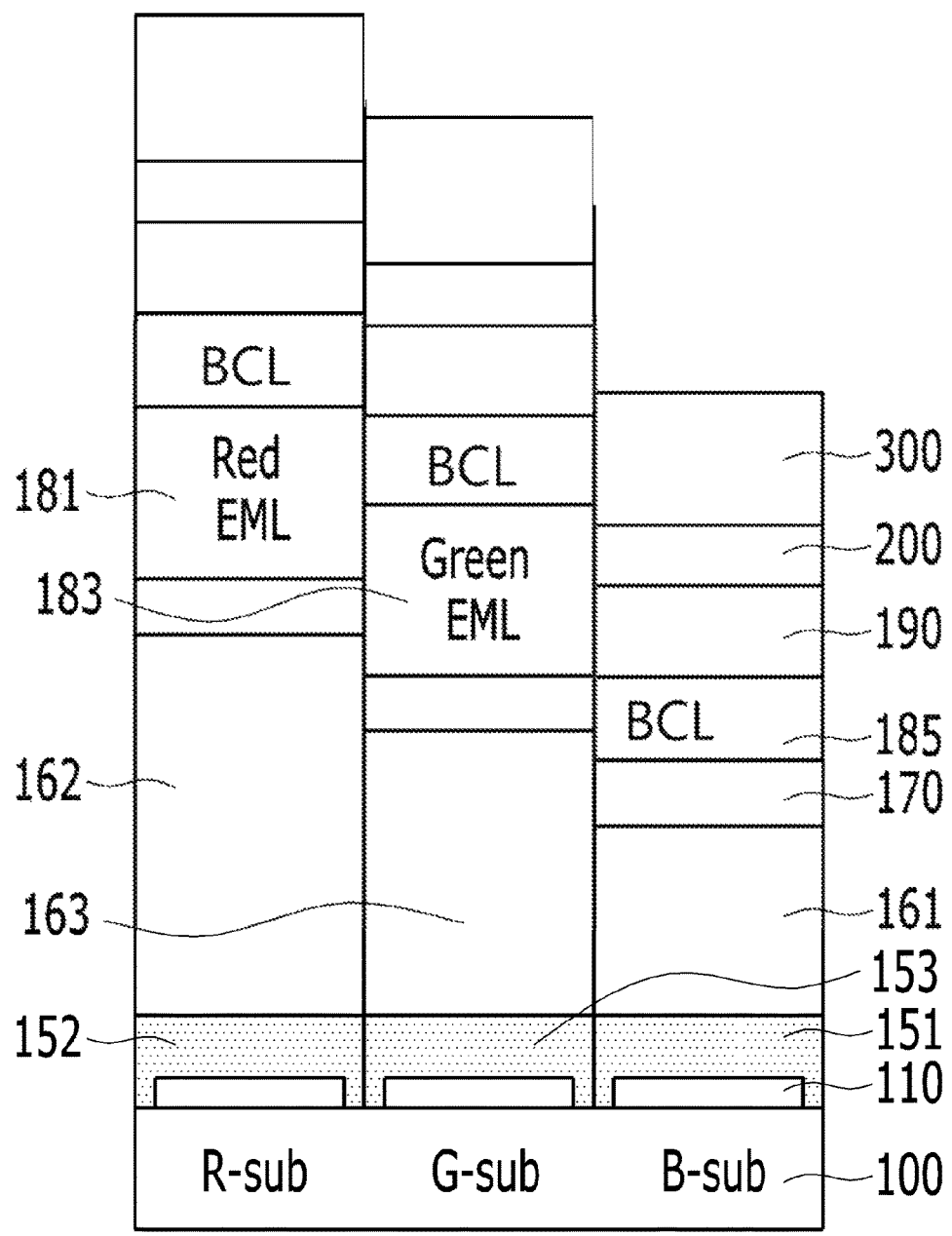
FIG. 6 is a sectional view schematically illustrating one pixel of an organic light emitting display panel according to a second embodiment of the present invention.

FIG. 6 is a sectional view schematically illustrating one pixel of an organic light emitting display panel according to a second embodiment of the present invention.

FIG. 6 shows one pixel of the organic light emitting display panel according to the second embodiment according to the present invention and is different from the organic light emitting display panel of the afore-mentioned first embodiment in that the blue light emitting layer 185 is formed in common in sub-pixels, and light emitting layers including a red light emitting layer 181 and a green light emitting layer 183 are provided under the blue light emitting layer 185 in both the red sub-pixel and the green sub-pixel.

That is, the second embodiment is different from the first embodiment in that the red sub-pixel and the green sub-pixel have a double layer structure including a light emitting layer emitting its own color of light and a blue light emitting layer.

As such, the second embodiment in which the blue light emitting layer 185 is shared among the sub-pixels also has a vertical structure in which the hole injection layers 151, 152 and 153 having higher electrical conductivity are separately formed among the sub-pixels, thus preventing transfer of lateral leakage current.

Meanwhile, the aforementioned drawings of the first and second embodiments of FIGS. 5 and 6 show the boundary structure between the sub-pixels of FIG. 4. That is, the hole injection layer and the hole transport layer are completely separated among the sub-pixels.

Figure 7:
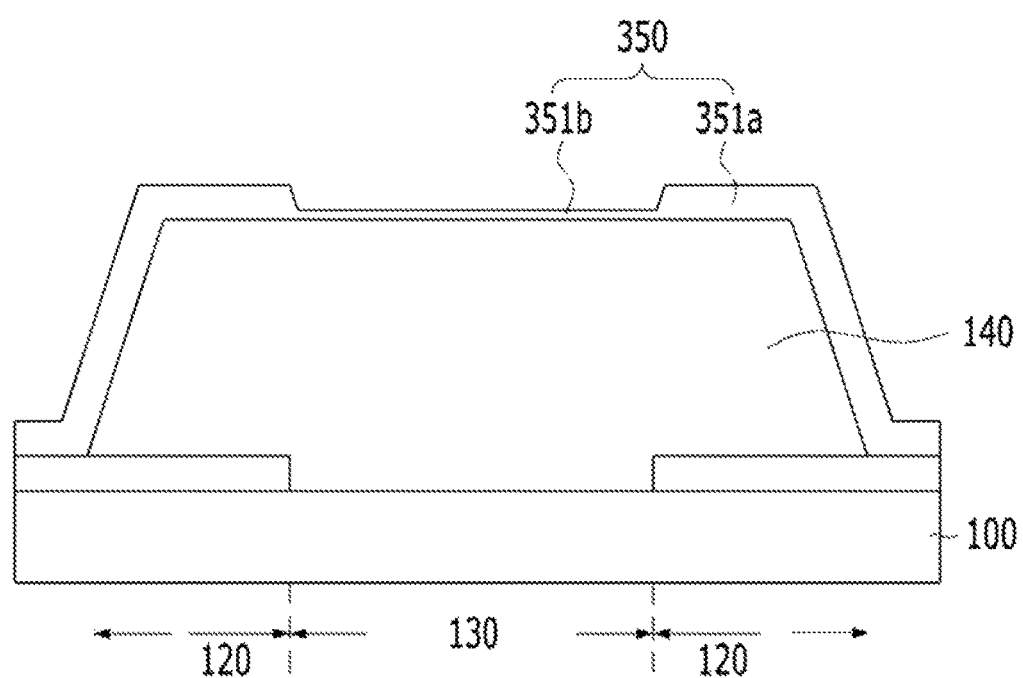
FIG. 7 is a sectional view schematically illustrating the boundary between two sub-pixels of an organic light emitting display panel according to another embodiment of the present invention.

FIG. 7 is a sectional view schematically illustrating the boundary between two sub-pixels of an organic light emitting display panel according to another embodiment of the present invention.

As shown in FIG. 7, in the organic light emitting display panel according to another embodiment, some of the hole injection layer or the hole transporting organic material 351*b* remains in an area where an organic material 350 disposed on the bank 140 corresponds to the separation part 130. During formation of the hole injection layer or the hole transport layer for separation of the sub-pixel, a blocking part is provided in the boundary between sub-pixels and the corresponding deposition material is deposited in the sub-pixel region through the remaining opening part. During this process, some deposition material is injected into the region corresponding to the blocking part and is deposited to a predetermined thickness on the separation part 130 as well. However, the separation part 130 corresponds to the blocking part of the deposition mask. In this case, as well, the thickness of the organic material 351*b* deposited on the separation part 130 on the bank 140 is less than about 10 Å, which is significantly less than the thickness, several hundred or thousand Å of the organic material 351*a* of the light emitting part, or the gap 120 between another light emitting part and the separation part. For this reason, the conductivity of the organic material 351*b* of the separation part 130 is negligible due to high resistance of this area. In addition, the remaining organic material 351*b* of the separation part 130 has electrical conductivity of less than 3.0E-9 S/cm due to small thickness and thickness irregularity, and therefore cannot function as a channel enabling lateral leakage current to flow between the sub-pixels.

Meanwhile, in the boundary between the sub-pixels shown in the drawing, an element represented by reference numeral "350" is an organic layer formed on the bank 140 and a second electrode (see 200 of FIG. 4) may be formed on the organic layer 350.

Hereinafter, an effect of conducting blue lighting for testing at a low gray scale in the organic light emitting display panel of the present invention will be described.

Figure 8:
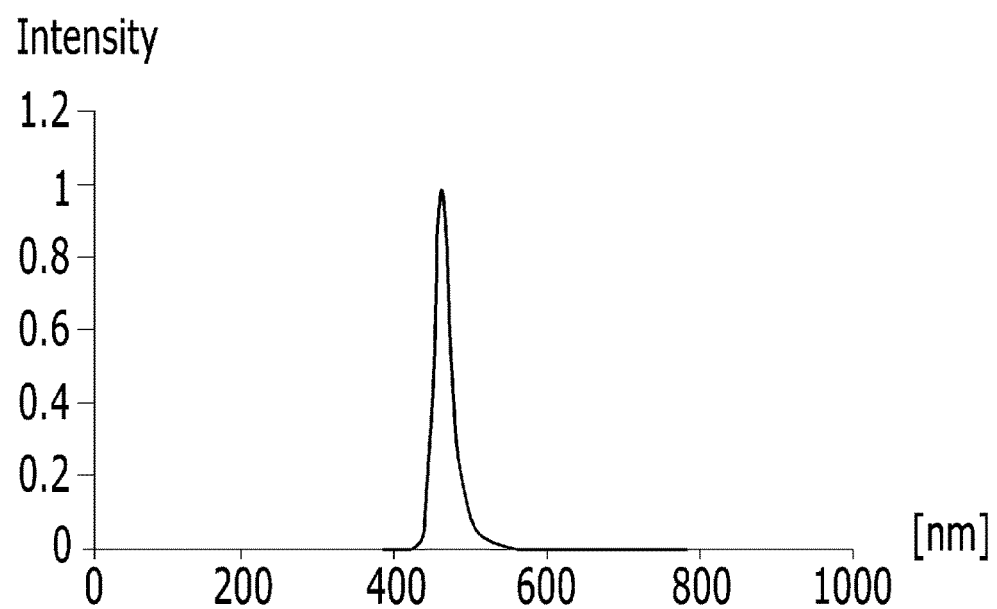
FIG. 8 is a graph showing an example of intensity as a function of wavelength upon blue light emission for testing at a low gray scale of the organic light emitting display panel according to the present invention.

FIG. 8 is a graph showing intensity as a function of wavelength upon blue light emission for testing at a low gray scale of the organic light emitting display panel of the present invention.

As shown in FIG. 8, when light emission for testing is conducted on the blue sub-pixel and a low gray scale is selected upon application of the organic light emitting display panel of the present invention, only light emission of pure color in the blue sub-pixel is observed without different colors of leaked light emission. That is, lateral leakage current is prevented upon application of the organic light emitting display panel of the present invention, thus providing color separation among the sub-pixels and thereby representing pure blue. This means improved color purity.

The organic light emitting display panel according to the embodiments of the present invention has the following effects.

First, the organic light emitting display panel includes only organic materials having low electrical conductivity on the bank disposed at the boundary between the sub-pixels, thereby preventing lateral leakage current from flowing to the adjacent sub-pixels through the common layer.

Second, it is possible to prevent abnormal lighting caused by lateral leakage current, and furthermore, it is possible to prevent light emission of different color sub-pixels during driving of selectively a certain sub-pixel and thus improve color purity.

Third, when a hole injection layer is separately deposited in the respective sub-pixels, an upper hole transport layer is also deposited using the same deposition mask with the mask for forming the hole injection layer, thus reducing use of the deposition mask required for separate deposition.

In addition, it will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents. For example, respective components specifically shown in the embodiments can be implemented in modified forms.

What is claimed is:

1. An organic light emitting display panel comprising:
a substrate comprising a plurality of sub-pixels, each sub-pixel comprising a light emitting part and a non-light emitting part surrounding the light emitting part;
a first electrode provided in the light emitting part provided in each sub-pixel;
a bank provided in the non-light emitting part;
a hole injection layer provided in the light emitting part of each sub-pixel while contacting the first electrode, and having a separation part on the bank of each sub-pixel;
a hole transport layer divided along the separation part and contacting the hole injection layer;
a plurality of light emitting layers provided on the hole transport layer in the light emitting parts of respective sub-pixels;
a first common layer provided on the light emitting layers over the sub-pixels; and
a second electrode provided on the first common layer.

2. The organic light emitting display panel according to claim 1, wherein an organic stack comprising a first common layer disposed between the bank and the second electrode at the separation part has an electrical conductivity of less than approximately 3.0E-9 S/cm.

3. The organic light emitting display panel according to claim 1, wherein the separation part is provided in a part of the bank, and the separation part is connected at the boundary between the sub-pixels.

4. The organic light emitting display panel according to claim 3, wherein the separation part is spaced from the light emitting part by a predetermined distance.

5. The organic light emitting display panel according to claim 4, wherein a thickness between the bank and the second electrode at the separation part is smaller than a thickness between the bank and the second electrode at a region spaced by the predetermined distance between the light emitting part and the separation part.

6. The organic light emitting display panel according to claim 5, wherein the hole injection layer and the hole transport layer are provided at the region spaced by the predetermined distance between the light emitting part and the separation part.

7. The organic light emitting display panel according to claim 4, wherein an organic stack between the bank and the second electrode at the region spaced by the predetermined distance between the light emitting part and the separation part has an electrical conductivity of approximately 3.0E-9 S/cm to approximately 5.0E-6 S/cm.

8. The organic light emitting display panel according to claim 1, further comprising:
a second common layer between the hole transport layer and the light emitting layers over the sup-pixels.

9. The organic light emitting display panel according to claim 8, wherein the first common layer comprises an organic material capable of transporting electrons,
the second common layer comprises an organic material capable of transporting holes and blocking electrons, and
each of the first and second common layers has an electrical conductivity of less than approximately 3.0E-9 S/cm.

10. The organic light emitting display panel according to claim 1, wherein the hole injection layer and the hole transport layer have a same opening area at the separation part.

11. The organic light emitting display panel according to claim 1, wherein the plurality of sub-pixels comprise a red sub-pixel, a green sub-pixel and a blue sub-pixel,
the light emitting layer of the red sub-pixel comprises a red light emitting layer,
the light emitting layer of the green sub-pixel comprises a green light emitting layer, and
the light emitting layer of the blue sub-pixel comprises a blue light emitting layer.

12. The organic light emitting display panel according to claim 11, wherein the blue light emitting layer extends to the green sub-pixel and the red sub-pixel, and is provided on the green light emitting layer and the red light emitting layer.

* * * * *